United States Patent
Bollea et al.

(10) Patent No.: US 7,651,246 B2
(45) Date of Patent: Jan. 26, 2010

(54) OPTICAL ELEMENT AND MODULE FOR THE PROJECTION OF A LIGHT BEAM, AND MOTOR VEHICLE LAMP INCLUDING A PLURALITY OF SUCH MODULES

(75) Inventors: Denis Bollea, Orbassano (IT);
Piermario Repetto, Orbassano (IT);
Stefano Bernard, Orbassano (IT);
Davide Capello, Orbassano (IT); Sabino Sinesi, Orbassano (IT); Gianluca Rotaris, Orbassano (IT)

(73) Assignee: C.R.F. Societa Consortile per Azioni, Orbassano (Turin) (IT)

( * ) Notice: Subject to any disclaimer, the term of this patent is extended or adjusted under 35 U.S.C. 154(b) by 173 days.

(21) Appl. No.: 11/577,276
(22) PCT Filed: Oct. 6, 2005
(86) PCT No.: PCT/EP2005/055057
§ 371 (c)(1),
(2), (4) Date: Apr. 13, 2007
(87) PCT Pub. No.: WO2006/040291
PCT Pub. Date: Apr. 20, 2006

(65) Prior Publication Data
US 2008/0106910 A1 May 8, 2008

(30) Foreign Application Priority Data
Oct. 14, 2004 (EP) .................. 04425775

(51) Int. Cl.
*F21V 5/00* (2006.01)
(52) U.S. Cl. .......... 362/329; 362/332; 362/333; 362/336; 362/338; 362/509
(58) Field of Classification Search ............... 362/328, 362/327, 329, 332, 333, 336, 337, 334, 338, 362/339, 340, 509, 540, 545
See application file for complete search history.

(56) References Cited

U.S. PATENT DOCUMENTS
2,254,962 A * 9/1941 Bitner et al. ............... 362/327
(Continued)

FOREIGN PATENT DOCUMENTS
DE  197 28 354 C2  1/1999
(Continued)

*Primary Examiner*—Jacob Y Choi
(74) *Attorney, Agent, or Firm*—Sughrue Mion, PLLC (57) ABSTRACT

An optical element and module for the projection of a light beam, and motor vehicle lamp including a plurality of such modules An optical element for the projection of a light beam comprises a solid body (1) of transparent material in which is formed a cavity (13) able to receive a light source (10), the cavity (13) extending along the principal axis (z) of the transparent body (1) and being delimited by a radially inner surface (3) and a terminal surface (2) of the transparent body (1). The surfaces (2, 3) are able to receive separate respective portions (I, II) of the light flux generated by the source (10). The transparent body (1) further has a radially outer surface (4) which surrounds the radially inner surface (3). The radially outer surface (4) reflects the portion of the light flux (I) coming from the radially inner surface (3) along a direction substantially parallel to the principal axis (z). The transparent body (1) has, on the opposite side, a central surface (6) and an annular surface (5) surrounding the central surface (6), able to receive that portion (II) of the light flux and the reflected portion of the light flux (I) respectively and to transmit these light flux portions (I, II) in directions having predetermined orientations with respect to the principal axis (z). At least one of the surfaces (2, 3, 5, 6) is rotationally asymmetric with respect to the principal axis (z) of the transparent body (1). The surfaces (2, 3, 5, 6) cooperate in such a way as to shape the overall light flux (I, II) emitted by the central and annular surfaces (6, 5) into a light intensity distribution having different divergences in two 25 directions perpendicular to one another and to the principal axis (z).

30 Claims, 12 Drawing Sheets

U.S. PATENT DOCUMENTS

| | | | |
|---|---|---|---|
| 4,767,172 A * | 8/1988 | Nichols et al. | 385/146 |
| 5,704,709 A | 1/1998 | Zwick et al. | |
| 5,757,557 A * | 5/1998 | Medvedev et al. | 359/708 |
| 5,841,596 A | 11/1998 | Perlo et al. | |
| 5,884,995 A | 3/1999 | Perlo et al. | |
| 6,536,923 B1 * | 3/2003 | Merz | 362/327 |
| 6,755,556 B2 * | 6/2004 | Gasquet et al. | 362/329 |
| 7,098,485 B2 * | 8/2006 | Isokawa | 257/98 |
| 7,111,964 B2 * | 9/2006 | Suehiro et al. | 362/328 |
| 7,270,454 B2 * | 9/2007 | Amano | 362/522 |
| 7,401,948 B2 * | 7/2008 | Chinniah et al. | 362/326 |
| 7,461,960 B2 * | 12/2008 | Opolka et al. | 362/545 |
| 7,473,013 B2 * | 1/2009 | Shimada | 362/327 |
| 2002/0080615 A1 * | 6/2002 | Marshall et al. | 362/333 |
| 2003/0202241 A1 | 10/2003 | Blummel | |
| 2004/0070855 A1 * | 4/2004 | Benitez et al. | 359/858 |

FOREIGN PATENT DOCUMENTS

| | | |
|---|---|---|
| EP | 0 798 788 A1 | 10/1997 |
| EP | 1 600 908 A2 | 11/2005 |
| FR | 2 867 257 | 3/2005 |
| JP | 61-147585 A | 7/1986 |
| WO | WO 00/24062 A1 | 4/2000 |
| WO | WO 03/048637 A1 | 6/2003 |
| WO | WO 03/074931 A1 | 9/2003 |
| WO | WO 03/098711 A1 | 11/2003 |
| WO | WO 2004/032250 A1 | 4/2004 |

* cited by examiner

OPTICAL ELEMENT AND MODULE FOR THE PROJECTION OF A LIGHT BEAM, AND MOTOR VEHICLE LAMP INCLUDING A PLURALITY OF SUCH MODULES

The present invention relates in general to modules for the projection of light beams.

Modules of this type are already known, for example, from Japanese Patent Application JP 61-147585, which describes a module which collimates a light beam, comprising an LED mounted on a support and a total internal reflection lens having a cavity in which the LED is housed. Both the lens and the LED are housed in a cylindrical casing.

The main advantage of devices described in the Japanese Patent Application resides in the fact that they have a high luminous efficiency, that is to say the ratio between the flux re-emitted by the device and that emitted by the source is generally greater than 85%, because they exploit total internal reflection. Another important advantage resides in the fact that it is not necessary to provide the device with a metal coating to allow the reflection of the rays incident on the lateral surfaces.

In general, to provide illumination apparatus, several modules of this type can be disposed on a common support plane, on which are disposed a multiplicity of sources. The direction of collimation is perpendicular to the said support plane, and the distribution of intensity is radially symmetric with respect to the said direction of collimation.

In order to apply this arrangement, or other similar arrangements, to motor vehicle lamps it is necessary to obtain optical performance which cannot be achieved through the above-cited devices. In fact, for the purpose of minimising the thickness of the lamp, it is in general necessary that the support plane on which the collimation modules are installed be parallel to the covering of the motor car; this covering is typically inclined with respect to the plane perpendicular to the motor vehicle axis in such a way that the collimation direction forms a corresponding angle relative to the motor vehicle axis. This therefore makes it necessary to introduce a prismatic component to reorientate the light beam leaving the collimator; it is possible to design the collimator in such a way that the beam exit direction is inclined with respect to the axis perpendicular to the support plane, but in general this requires that at least one portion of the lateral surface be coated with a reflecting coating, which reduces the efficiency and increases cost.

Alternatively, a prismatic component can be introduced through a prism structure formed on the exit surface of the collimator (Patent Application WO 00/24062), or on an additional glass positioned in front of the collimator itself.

Moreover, for the different signalling functions of the lamp it is necessary for the light beams emitted from the system to satisfy determined requirements of spread imposed by the regulations which are in force.

For example, in the case of the stop function, the spread of the beam in the horizontal plane (parallel to the road) is critical in that spread half-angles greater than 20° are required, whereas the spread half-angle in the vertical direction is distinctly less (10°). By utilising radially symmetrical modules (as described in Patent Applications JP 61-147585 and WO 00/24062) a distribution with substantially the same spread in the horizontal and vertical directions is in general obtained; to satisfy the photometric regulations in the horizontal direction therefore involves achieving a vertical spread greater than that required, with consequent wastage of luminous flux, increase of consumption and/or the number of light sources and therefore the cost.

International Patent Application WO 00/24062 presents a possible solution to this problem by introducing a different prismatic component for the different collimators constituting the system, in such a way that the combination of these collimators makes it possible to generate a predetermined distribution of light. The limitation of this solution lies principally in the fact that, for a certain direction of observation, only the part of the device including the collimators which collimate the light in this direction of observation will appear illuminated.

Generally, to produce a predetermined light distribution, these collimators can be combined with prismatic systems or micro lenses able to spread the exit beam from the collimator and, possibly, to modify the direction thereof.

The prismatic power is obtained with a single interface (between the material constituting the collimator and air), which limits the possible angle of deviation to the angle of total internal reflection (TIR) between the two materials constituting the interface (for example 41.8° in the case of a methacrylate-air interface); moreover, for angles close to the TIR angle the losses by reflection at the prismatic interface become significant and limit the efficiency of the module. A possible alternative is that of providing a second transparent prism, physically separated from the collimator and having the prisms on the internal interface (for example air-methacrylate) facing towards the collimator outlet; this makes it possible to divert the light in a more efficient manner by exploiting the refraction both on the (prismatic) inner wall and on the smooth outer wall. This arrangement can be combined with the previous one in such a way as to divide the prismatic power over several interfaces, thereby reducing the inclination of the prisms and maximising the transmission efficiency of the device.

Figure 2:
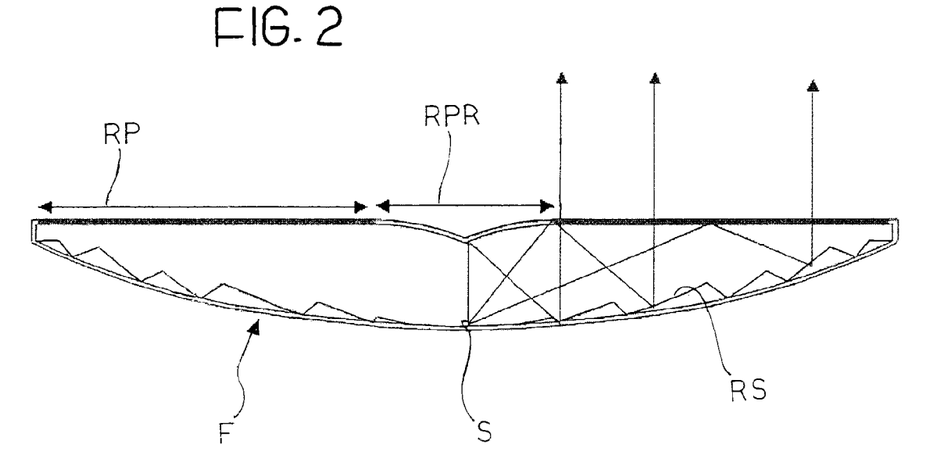
FIG. 2 shows the prior art.

One interesting solution for production of a thin lamp having LED devices was proposed by the applicant for the present application in U.S. Pat. No. 5,841,596 and U.S. Pat. No. 5,884,995; the said solution is represented in FIG. 2. These patents relate to a micro telescope device of the Cassegrain type. As known, the Cassegrain telescope is formed by a primary reflector which collects the light coming from outside and reflects it towards a secondary reflector; the secondary reflector further closes the beam and finally the image is created on the desired plane. Because of its particular geometry the Cassegrain telescope has an obscure zone corresponding to the secondary reflector, where the light cannot be captured. These two patents exploit the inverse principle, that is the light beam is generated by a quasi-point source S, for example of the LED type, which is located at the image plane of the telescope, and the light is extracted by the primary reflector RP after having been reflected by the secondary reflector RS. The device F is generally of transparent plastics or resin.

The principal advantage of the telescopic system lies in the fact that it makes it possible to restrict the thickness of the lamp; another advantage is that the device can have a high width-to-height ratio, which means that it can cover an extended surface of the lamp whilst the overall thickness thereof remains limited.

The principal disadvantage of this device lies in the fact that the extraction of the light does not take place over the entire exit surface of the device but only from the circular outer ring, in correspondence with the primary reflector RP, with the consequence that a darker central region is evident.

A further disadvantage lies in the fact that it is necessary selectively to coat some portions RPR of the lamp with reflecting metal layers which reduce the efficiency and involve a significant increase in production costs.

The object of the present invention is the production of a lamp which overcomes the limitations of the above-described solutions, in particular:

improving the uniformity of illumination from the surfaces of the lamp, maximising the efficiency and therefore limiting the number of sources and reducing the associated costs, reducing the thickness, limiting the manufacturing costs of the optical components by eliminating the metallic coatings.

According to the invention this object is achieved by means of an optical element for the projection of a light beam, having the characteristics defined in claim 1.

By means of such an element it is possible to provide a module operating to control the light emitted from a quasi-point source (for example an LED of SMD type or in the form of a chip). It is therefore possible to construct an illumination device, in particular a motor vehicle lamp, in which each individual signalling function is constituted by a plurality of the said modules juxtaposed and/or interconnected. The surfaces of these modules work both in refraction and in total internal reflection in a similar manner to that envisaged in Patent Applications JP 61-147585 and WO 00/24062; however, the said Patent Applications describe modules able to generate only radially symmetrical intensity distributions.

The intensity distribution generated by the modules of the present invention is, on the other hand, rotationally asymmetrical, which therefore makes it possible to minimise the number of sources/modules necessary to achieve a specific signalling function.

A further object of the invention comprises a module for the projection of a light beam, comprising an optical element according to the invention and a lamp for a vehicle including such module.

Preferred embodiments are defined in the dependent Claims.

Various preferred but non-limitative embodiments of the invention will now be described making reference to the attached drawings, in which.

Figure 3:
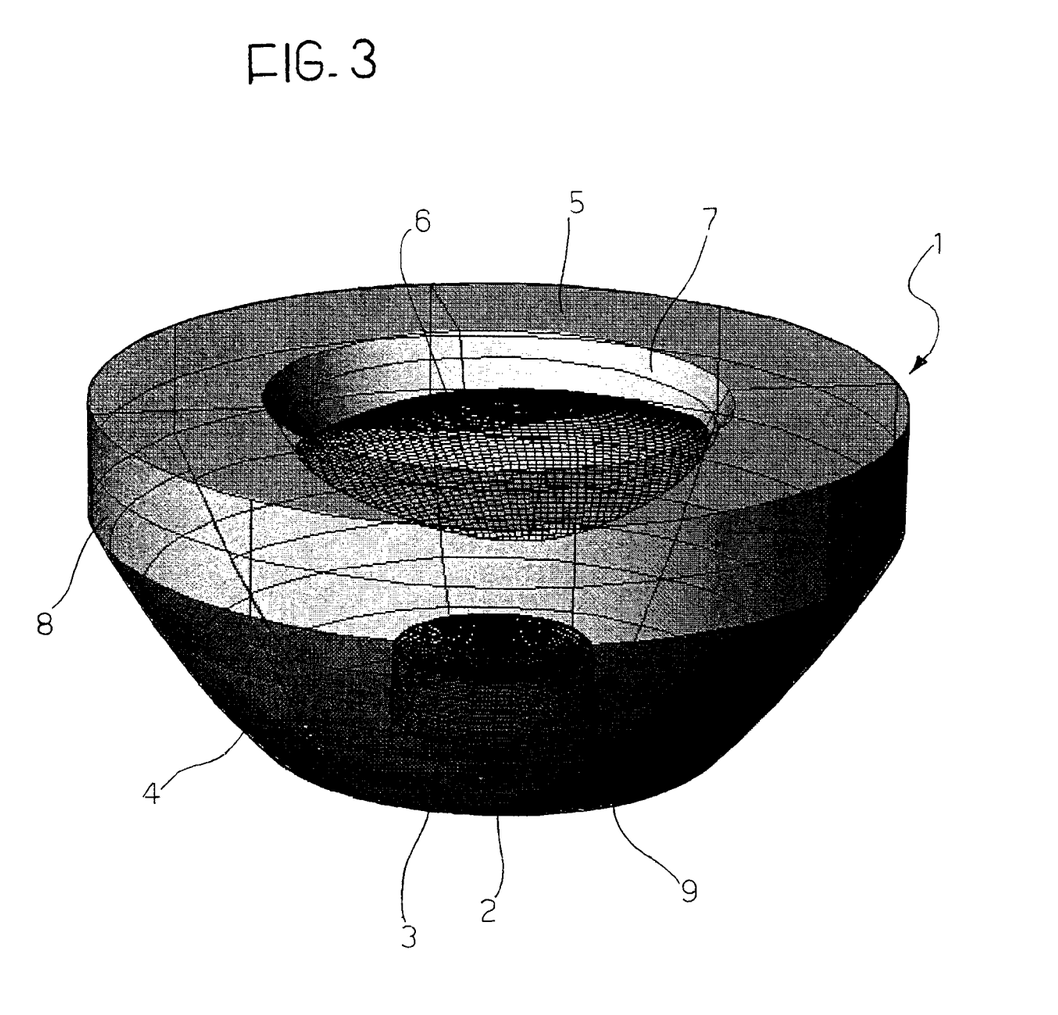
FIG. 3 is a three dimensional schematic representation of an optical element for the projection of a light beam according to the invention.
Figure 4A:
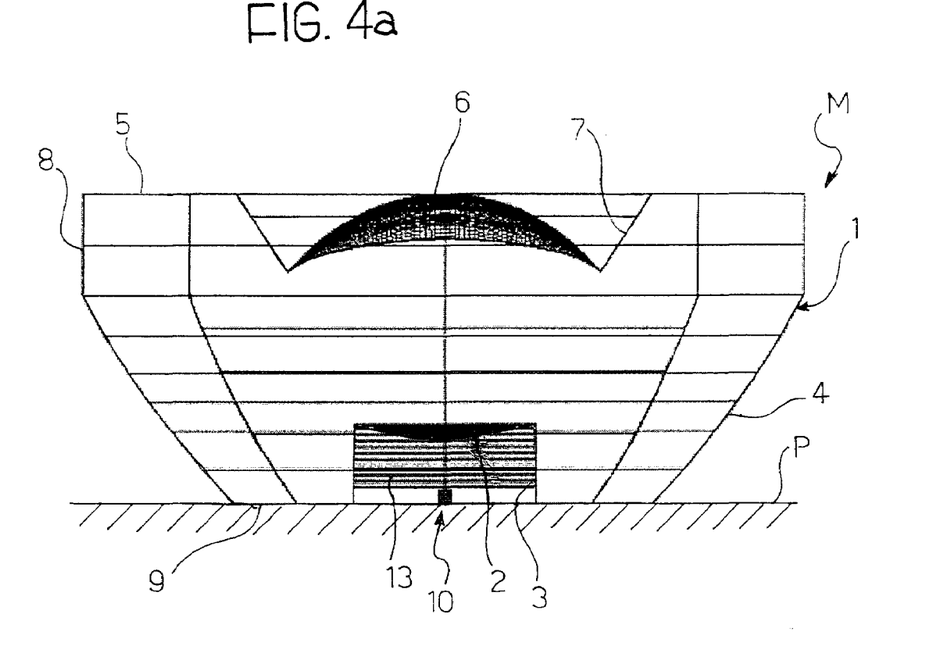
FIGS. 4a,b are schematic representations in longitudinal section of the optical element of FIG. 3.
Figure 4B:
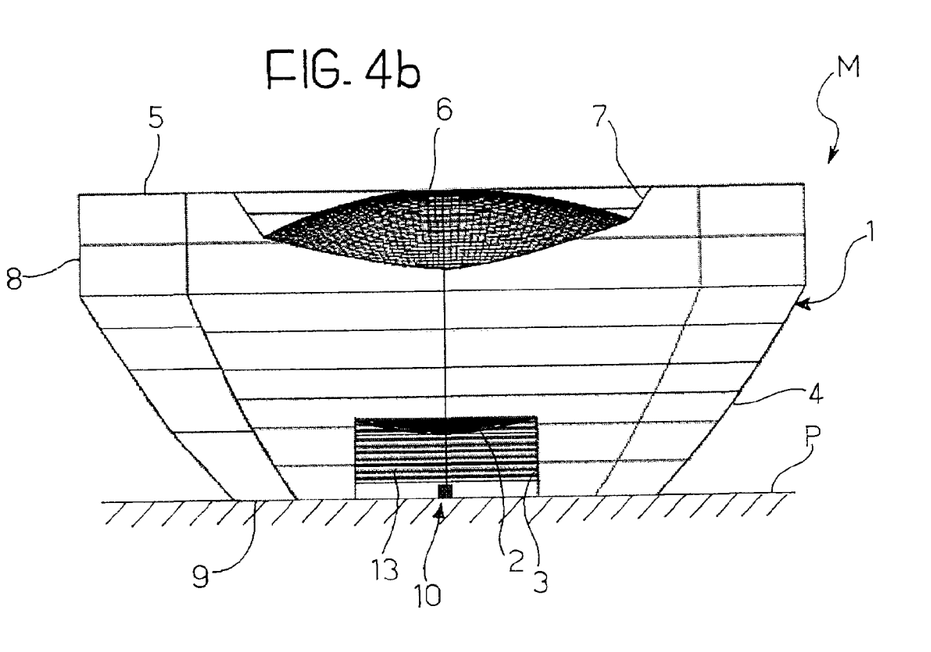
Figure 5:
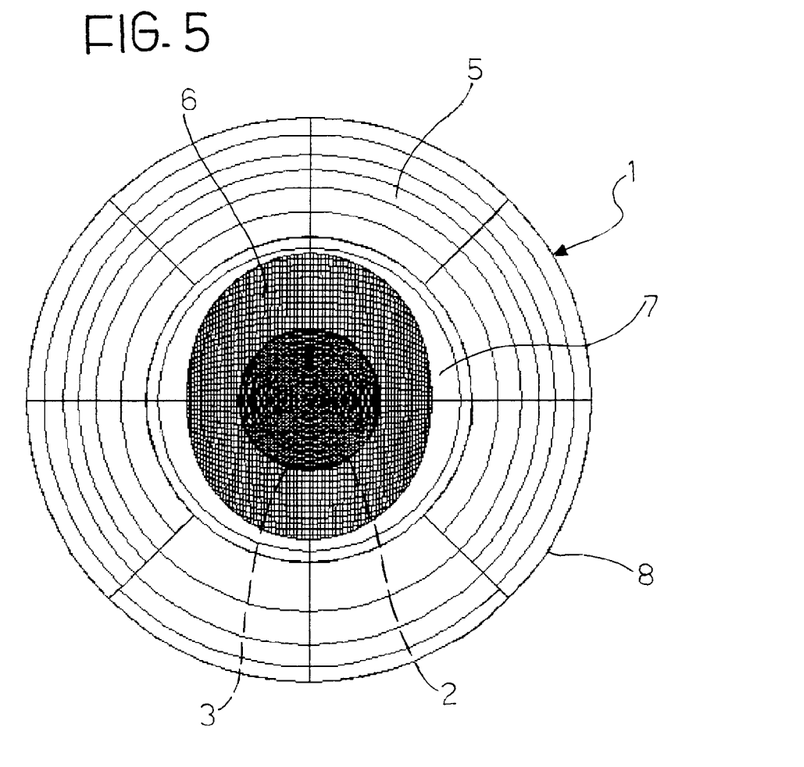
FIG. 5 is a plan view of the optical element of FIG. 3.

With reference to FIGS. 3 to 5, module M for the projection of a light beam comprises a light source 10 which is adapted to be disposed on a support plane P and an optical element able to convey the light emitted by the source 10 in a direction substantially perpendicular to the support plane P. This optical element has a solid body 1 of transparent material. The module in question is characterised by the fact that it is not obtainable as a single surface of revolution about the axis passing through the source and perpendicular to the support plane and by the fact that the module shapes the beam into an intensity distribution of light having a different spread in two directions perpendicular to one another and to the support plane.

This body 1 has a principal axis z which, in the mounted condition illustrated in FIG. 4, is substantially perpendicular to the support plane P. In the body 1 is formed a cavity 13 which extends along the axis z of the body 1 and is delimited by a radially inner surface 3 and by a terminal surface 2 of the body 1. The cavity 13 is able to house the source 10.

With reference to FIG. 4, the light source 10, preferably of solid state type, is then disposed between the support plane P of the body 1 and the surfaces 2 and 3 of the solid body itself. Technologically, the solid state source can be integrated in the module M by chip on board technology or by SMD. The chip on board technology (COB) is differentiated from SMD technology (Surface Mounted Device) by the use of semi-conductors directly on the printed circuit in place of discrete components within the plastics casing, that is to say the LED is composed only of the semi-conductor element (die), secured by adhesive to the support plate with a drop of epoxy resin. The principal advantage of COB technology lies in the fact that it can produce very thin lamps because all packaging typical of an LED is eliminated.

The body 1 further has a radially outer surface 4, preferably curved, disposed in such a way as to surround the radially inner surface 3 and, on the side opposite the cavity 13, a central surface 6, preferably curved and aligned with the terminal surface 2, and an annular surface 5 which surrounds this central surface 6. On one side the annular surface 5 is joined to the radially outer surface by means of a connecting surface 8. On the other side the annular surface 5 is joined to the central surface 6 by means of a connecting surface 7.

Figure 6:
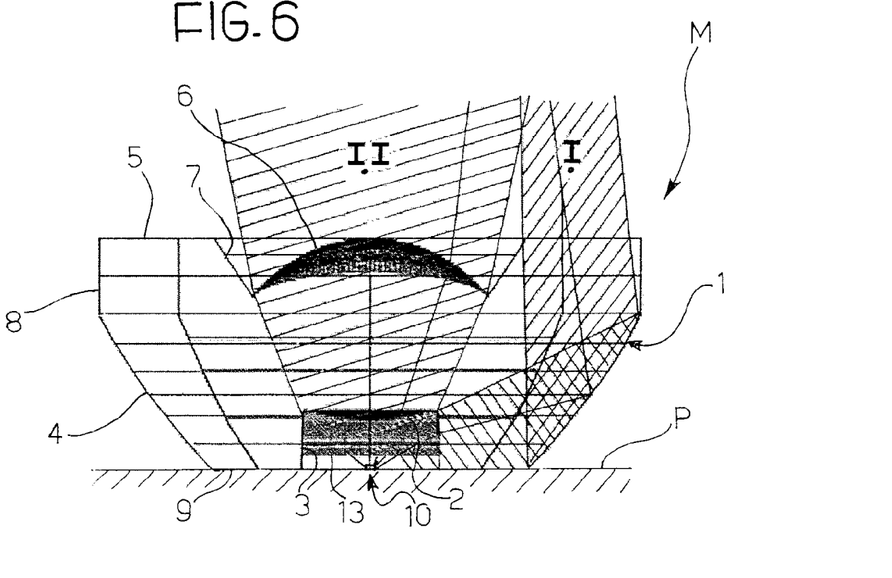
FIG. 6 shows a ray trace within the element of FIG. 3.

With reference to FIG. 6, the transparent body 1 has two distinct working zones, a central zone which works exclusively in transmission, and a peripheral zone which works in reflection, preferably total internal type (TIR) or possibly obtained by means of a reflecting metal layer. To separate the functions of the solid body 1 in a strict manner implies the necessity of dividing the light flux emitted by the source 10 into two parts I and II; the fact of maintaining the two light beams I and II separated makes it possible to avoid one zone of the device having to work for both beams, and therefore in an approximated manner, thus reducing the overall efficiency of the module in a significant manner.

The separation of the light emitted by the LED source 10 into two distinct light beams I and II takes place at the first interface; the terminal surface 2 collects a part II of the light coming from the source 10 and directs it towards the central surface 6. The radially inner surface 3 collects the other part I of the light flux coming from the source 10 and directs it towards the radially outer surface 4 which works in total internal reflection, which in turn reflects it towards the annular surface 5. This beam separation prevents any of the flux from finishing on the connecting collar 8. In order that the light flux be separated correctly it is important to calculate the meeting point between the terminal surface 2 and the radially inner surface 3; in fact, the meeting point of the two interfaces determines, by Snell's Law, the extreme rays beyond which the two beams I and II cannot go, as shown in FIG. 6. By working in this way the beams I and II are independent from one another and in this way it is possible to separate and treat the projecting of the part undergoing just transmission in a different manner from the part which undergoes total internal reflection.

The light emitted by the source 10 which is collected through the terminal surface 2 is directed towards the exit interface formed by the central surface 6. The terminal surface 2 has a rotational symmetry with respect to the axis z normal to the support plane P passing through the centre of the source 10, whilst the interface 6 is generally not a surface of revolution.

For the purpose of maximising the overall efficiency of the module M the ray which is collected at the extremity of the terminal surface 2 is deviated according to Snell's Law and made incident at the edge of the central surface 6, as shown in FIG. 6. Any other ray incident on the terminal surface 2 is also incident on the central surface 6 and contributes to the formation of the distribution of luminous intensity.

Figure 1:
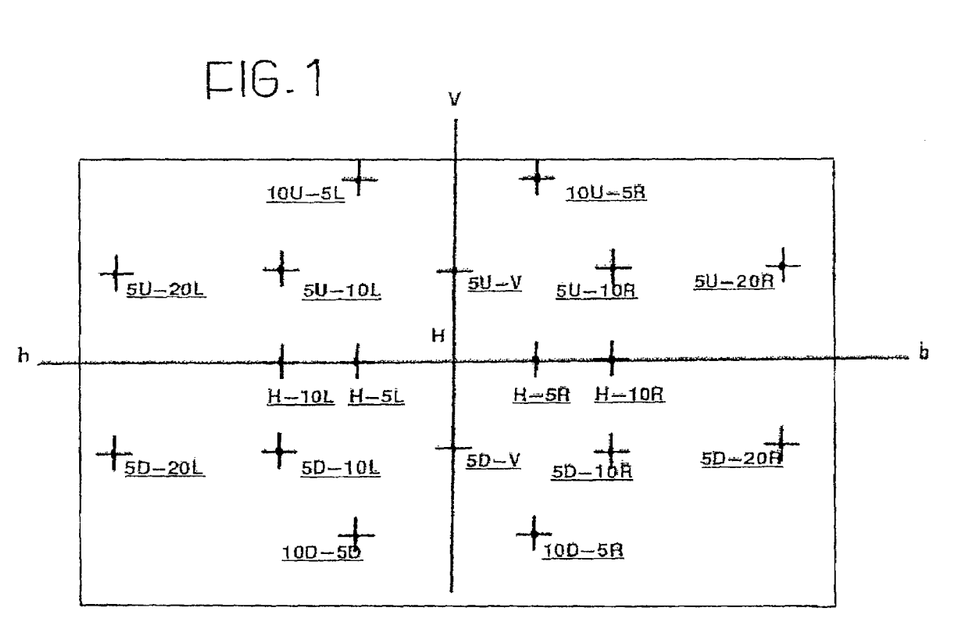
FIG. 1 shows a typical photometric distribution for one function of a lamp.
Figure 8A:
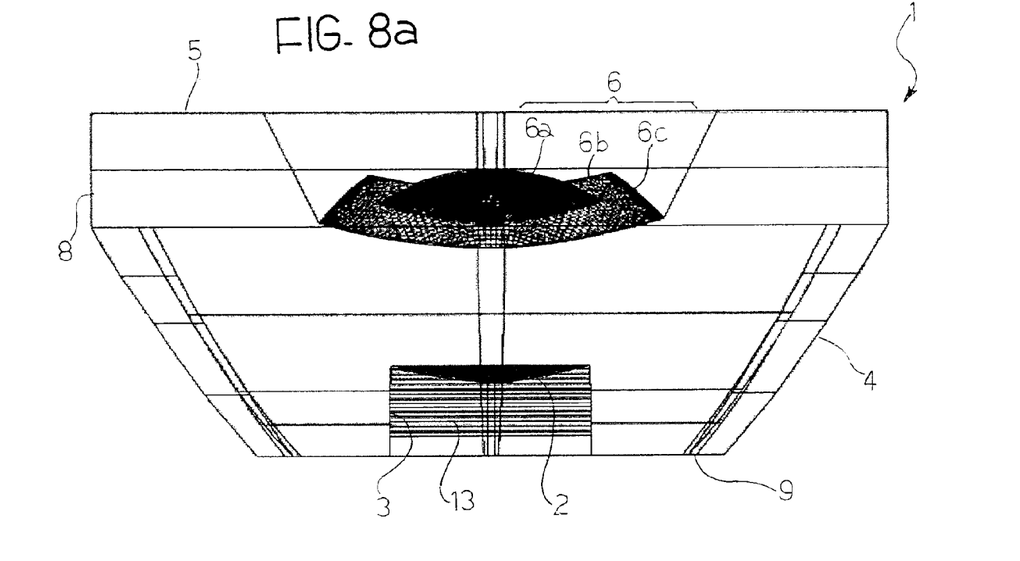
FIGS. 8a,b illustrate a variant of the element of FIG. 3 in a view similar to that of FIGS. 4a, 4b.
Figure 8B:
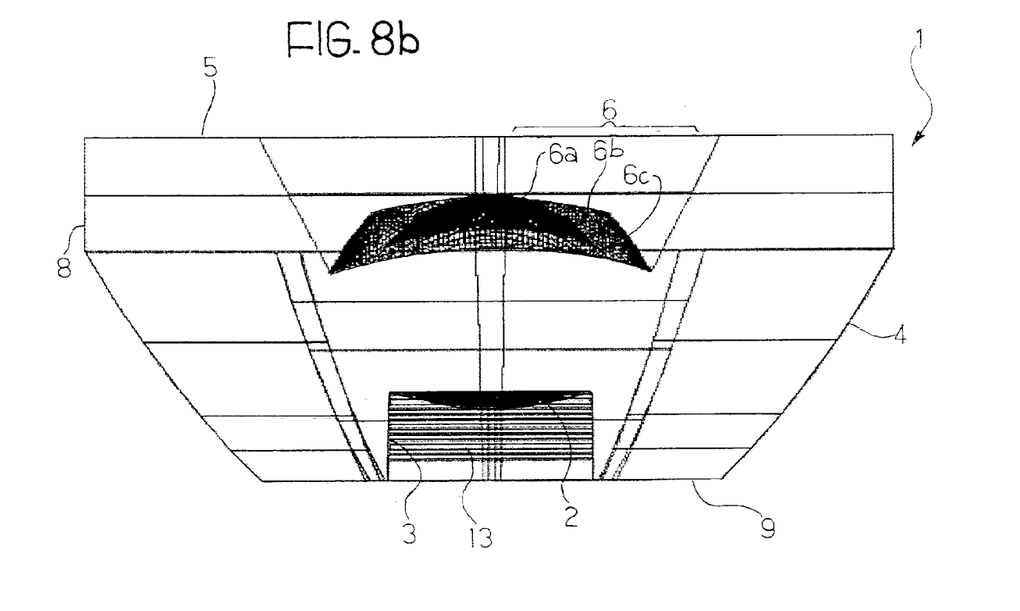

The surface 6 is rotationally asymmetric, being designed in such a way as to form a luminous intensity distribution of substantially uniform and rectangular shape, as shown in FIG. 1, which shows the test points which are taken to validate the individual functions of the lamp. In FIGS. 4a, b and 5 can be seen how upon rotating the body through 90 degrees the central surface 6 has a different section. Central surface 6 can be segmented into several parts 6a,b,c as illustrated in FIG. 8.

The connecting surface 7, of substantially conical form, is designed in such a way as not to interfere with the light exiting at large angles from the central surface 6, and at the same time in such a way as not to interfere with the extraction of light from the radially outer surface 4 which works in total internal reflection.

For each light function in a vehicle it is generally required that at the centre of the luminous intensity distribution, which corresponds to the axis passing through the vehicle the majority of the flux falls within the first ±10 horizontal degrees and the first ±5 vertical degrees. In that the central surface 6 has the purpose of generating a rectangular and substantially uniform intensity distribution of light it is necessary to add the luminous flux I to the central part of the distribution. To do this the radially outer surface 4 is used, which exploits the principle of total internal reflection.

Figure 9:
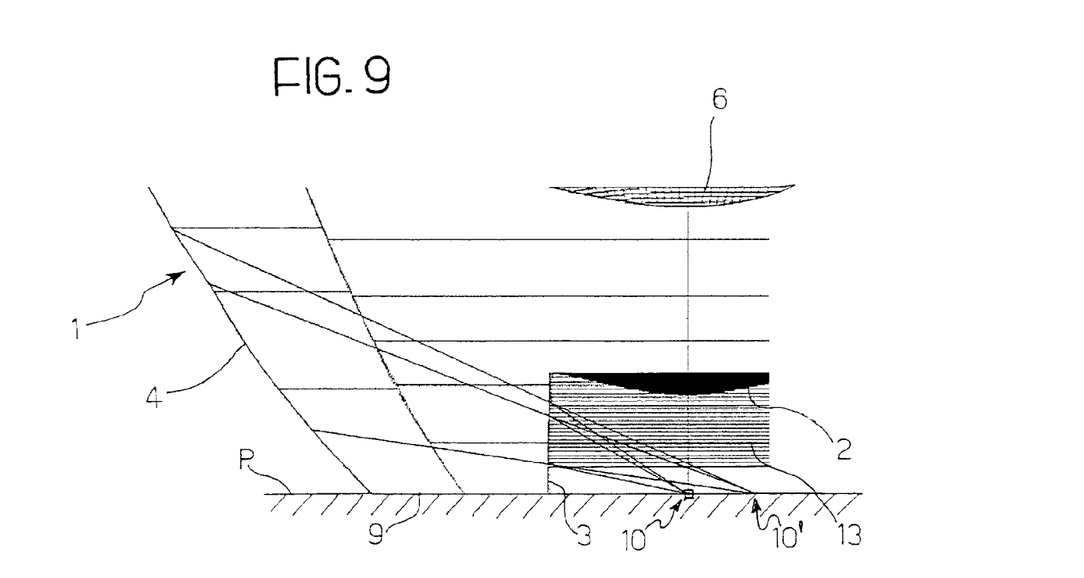
FIG. 9 illustrates the ray trace through a surface of the optical element of FIG. 3.

The radially inner surface 3 is of substantially cylindrical form, with axis of rotation coincident with the axis z normal to the support plane P and passing through the centre of the source 10. Each section of this surface 3 is substantially an aspherical lens profile and is constructed in such a way that the rays which are generated by the source 10 and incident on the surface 3 generate a single virtual point source 10', as shown in FIG. 9.

Figure 10:
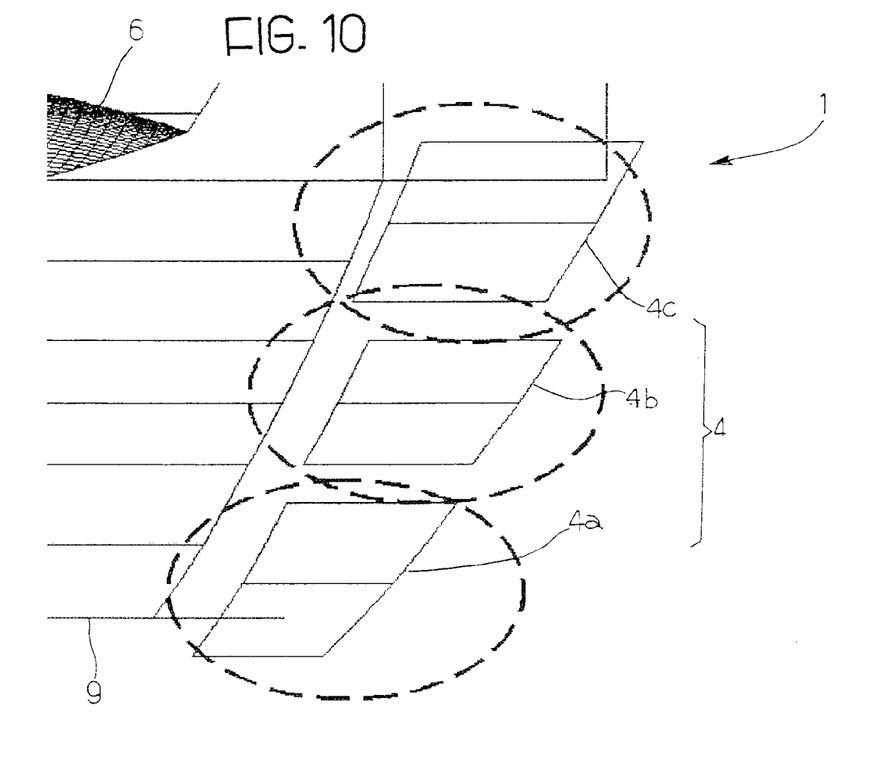
FIG. 10 is an exploded view of a surface of the optical element of FIG. 3.

The radially outer surface 4 has a generally ellipsoidal or parabolic shape, and makes use of the fact that the cylindrical surface 3 generates a virtual source 10' by making one of the two foci of the ellipsoid, or the focus of the parabola, substantially coincident with this source 10'. In this way the light beam is controlled and it is possible to direct the light in the desired direction. The radially outer surface 4 can be constructed with several paraboloid or ellipsoid parts according to the distribution of light intensity which it is desired to obtain. One example is shown in FIG. 10, where the radially outer surface 4 has been sub-divided into three elliptical surfaces 4a,b,c to direct the light flux I into the angular directions where the majority of the flux is required. A second focus of the ellipsoid is determined on the basis of angular considerations on the beam reflecting from the surface 4.

If a part of the radially outer surface 4 is a paraboloid, the focus will coincide with the virtual source 10'. If a paraboloid or an ellipsoid is used as the radially outer surface 4, reflection takes place by total internal reflection so that it is superfluous to coat this surface 4 with a metallic layer for the purpose of obtaining the reflection of the incident beam I. Consequently, a constructional simplification, and a significant reduction in costs is obtained and above all there is no loss of efficiency which any coating introduces. Nevertheless, in particular cases it can be necessary to provide a coating, even a partial one, on the radially outer surface 4.

Figure 11:
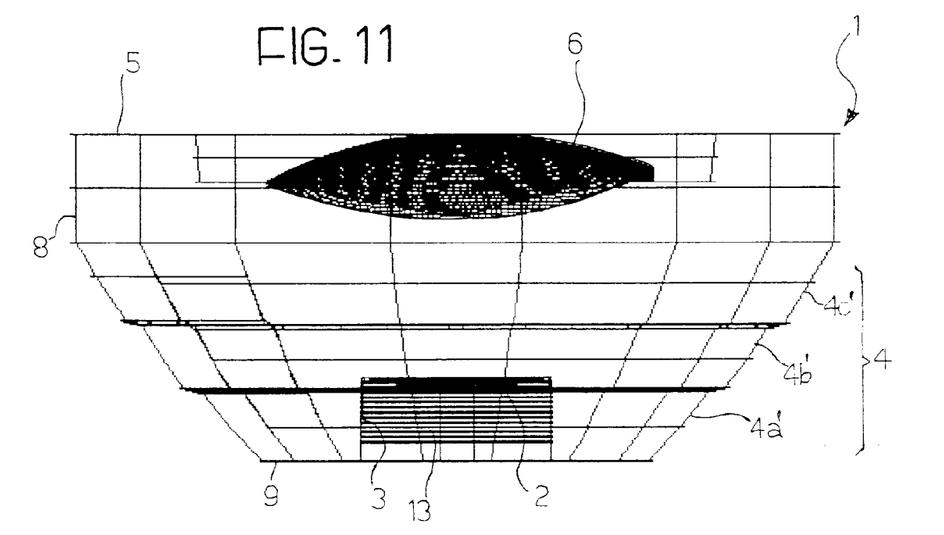
FIG. 11 illustrates a further variant of the optical element of FIG. 3.

The radially outer surface 4 may be continuous or may be segmented into segments 4a', 4b', 4c' as illustrated in FIG. 11. The surface 4 may be rotationally asymmetric with respect to the principal axis z passing through the centre of the source 10 and can vary geometrically from zone to zone as a function of the distribution of light intensity which it is desired to obtain. The annular surface 5 is generally flat and collects the flux coming exclusively from the interface 4.

Figure 7:
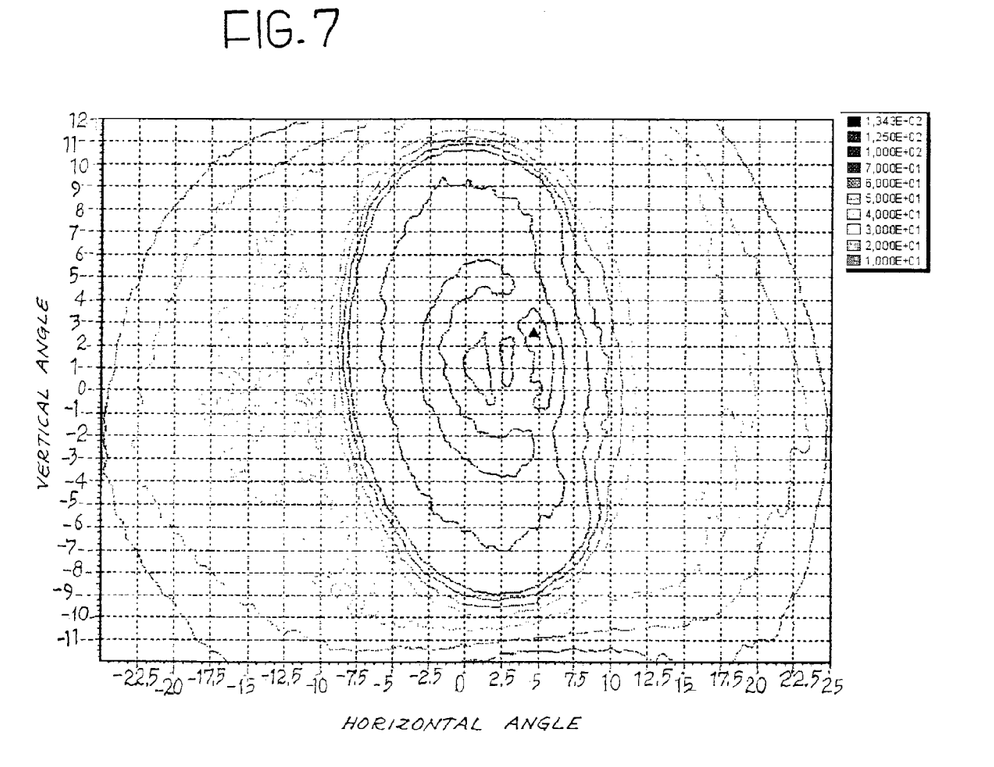
FIG. 7 illustrates a light intensity distribution obtainable with a module including the optical element of FIG. 3.

In FIG. 7 is shown a distribution of light intensity obtained with a module M according to the invention.

The body 1 rests on the support plane P via the flat parallel support surface 9 which has no optical power. The support surface 9 joins the radially inner surface 3 to the radially outer surface 4.

Figure 12:
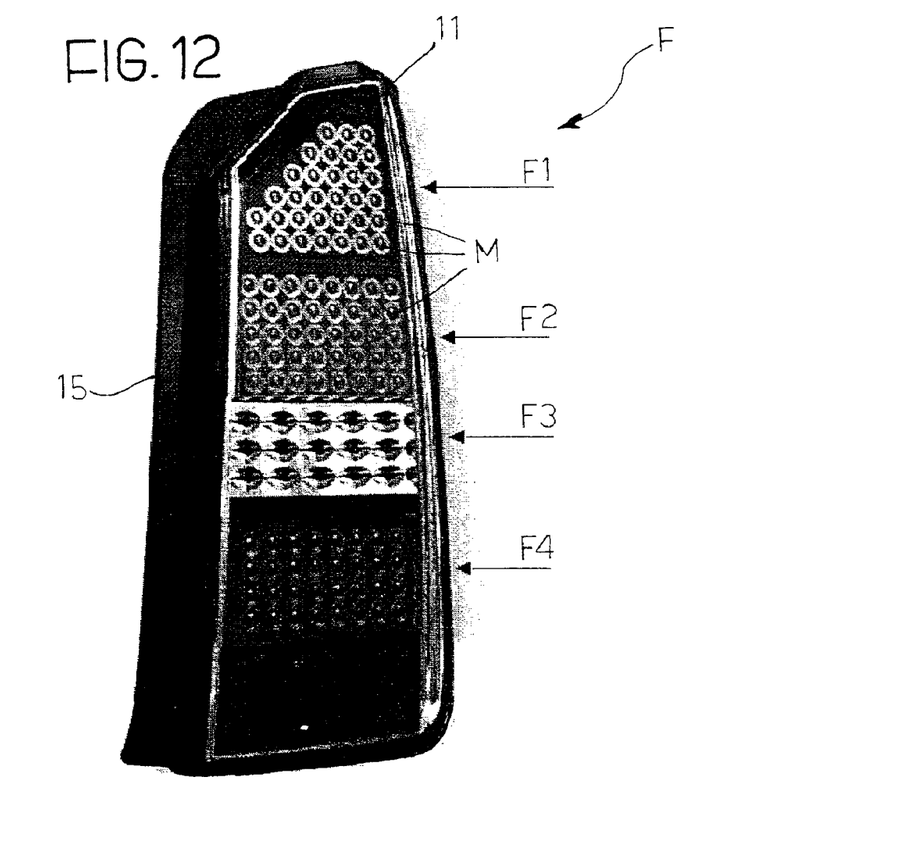
FIG. 12 illustrates a motor vehicle lamp formed by several portions, each portion operating a light signalling function, within which is arranged a plurality of modules according to the invention.
Figure 16:
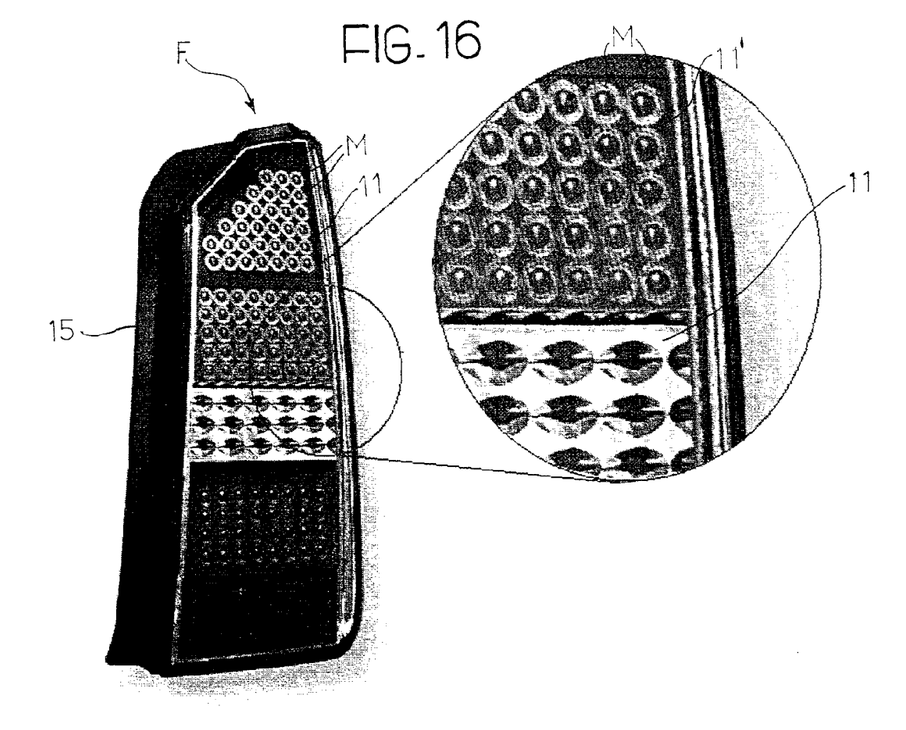
FIG. 16 is a view similar to that of FIG. 12, in which a portion of the lamp is represented on an enlarged scale.

With reference to FIGS. 12 and 16, a lamp F for a motor vehicle comprises one or more portions F1, F2, F3, F4 each operating a light function, and each of which comprises a plurality of modules M according to the invention. In particular, the portion F1 has the function of stop light signalling-tail light, the portion F2 has the function of direction indicator, the portion F3 has the function of back up lamp, and the portion F4 has the rear fog lamp function. The lamp F further includes a plastics container 15 and a transparent element 11 which performs the dual function of transmitting the light emitted by the modules M and directing this light along the axis of the vehicle.

For achievement of a lamp function it is in fact necessary to have a plurality of modules M; the number of these modules M depends principally on the flux which the LED source 10 can emit, and must be such as to satisfy the photometric characteristics required by the various motoring regulations in use. By way of example, for the stop lamp function of the lamp F it is possible to utilise sixteen devices of the type described and sixteen LED sources having a nominal flux of two lumens each.

If it is desired to limit the overall thickness of the lamp F, the modules M must be carried on a reference plane substantially parallel to the silhouette of the vehicle at the point at which the lamp is installed. In the majority of practical cases of application to vehicles the axis perpendicular to the support plane on which the modules are installed does not coincide with the longitudinal axis of the vehicle, that is to say the central direction of distribution of the light intensity; it is therefore necessary that the distribution of intensity generated by the individual modules be centred in correspondence with the axis of the vehicle. This thus makes it necessary to introduce a prismatic component which functions as an interface between the optical axis of the lamp F and the longitudinal axis of the vehicle.

This can be done in two ways:
(1) by modifying the surfaces of the optical element 1 in such a way as to produce a rotationally asymmetric intensity distribution centred in the direction of the longitudinal axis of the vehicle;
(2) by designing the modules M in such a way that the intensity distribution of light leaving the modules M is centred in a direction perpendicular to the support plane and arranging that the transparent optical element 11 operates to divert the light leaving the modules M, for example through a refractive or diffractive prismatic system.

The second arrangement is characterised by a greater modularity in that the optical element 1 has a geometry substantially independent of the geometry of the lamp and associated installation on the vehicle, depending instead uniquely on the geometric characteristics of the source and the photometric characteristics relating to the signalling function which each module M must achieve; in this sense, modules of identical geometry can be installed on different vehicles simply by modifying the prismatic form of the additional transparent element envisaged in solution (2) indicated above. This solution is illustrated in more detail herein below.

Figure 13A:
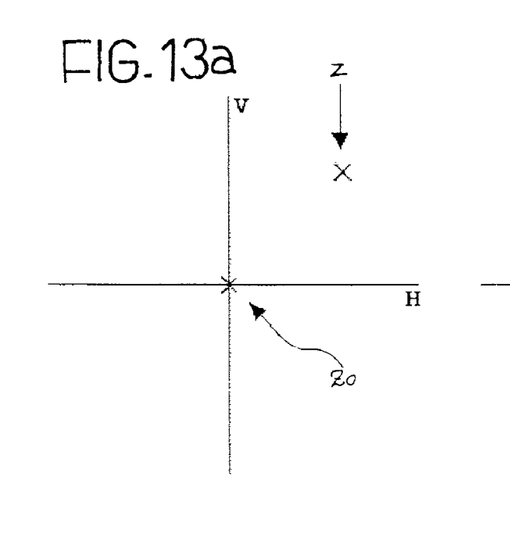
FIGS. 13 and 14 illustrate the logical sequences necessary to bring the photometric distribution of the modules of a lamp on the plane normal to the longitudinal direction of the vehicle by the introduction of prisms.
Figure 13B:
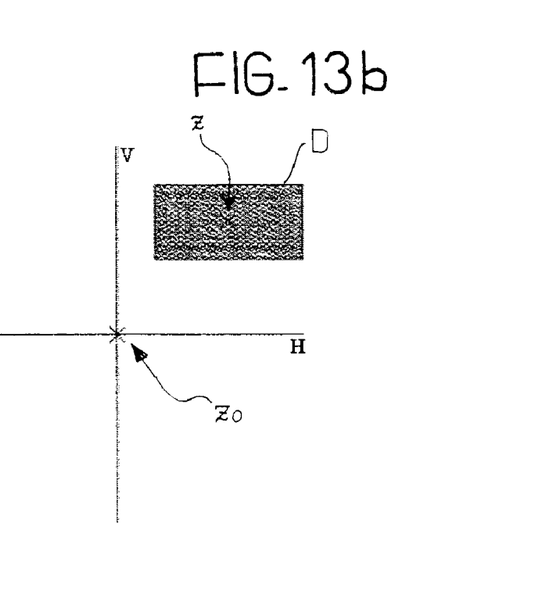
Figure 13C:
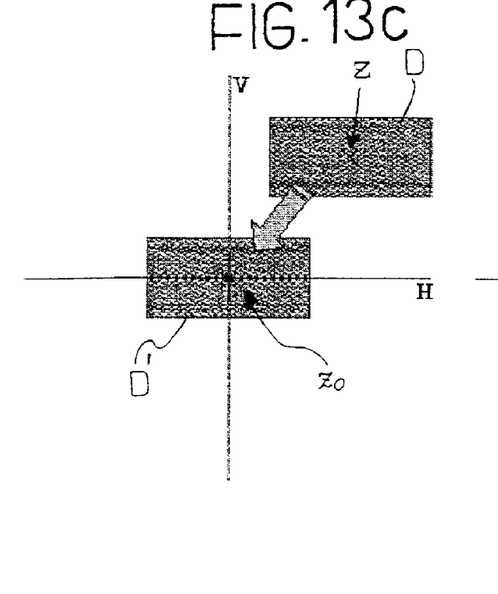
Figure 13D:
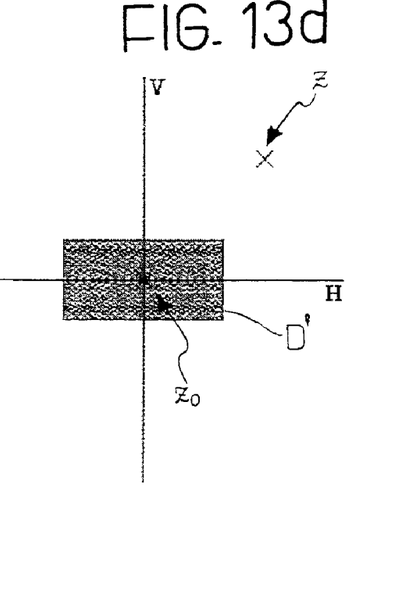
Figure 14A:
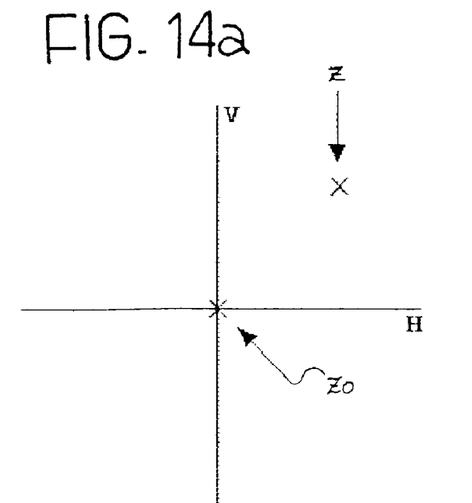
Figure 14B:
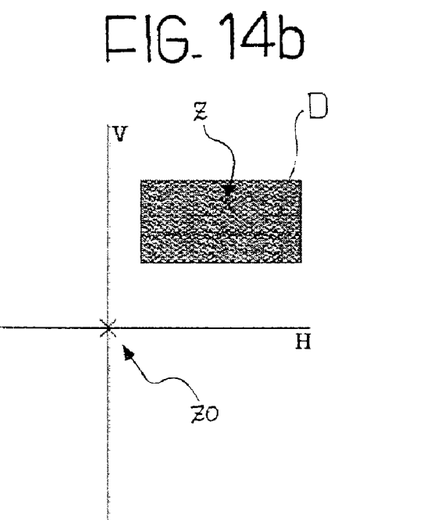
Figure 14C:
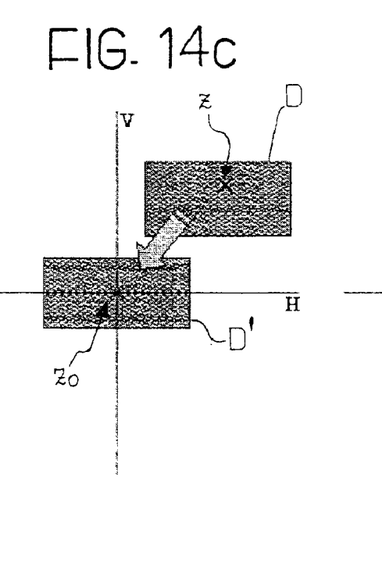
Figure 14D:
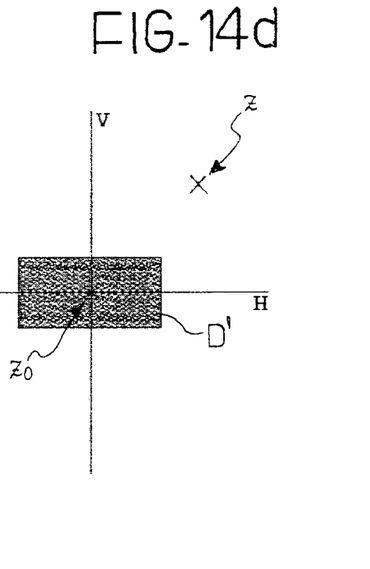

With reference to FIG. 13, the distribution of light intensity D of the module M is created along the optical axis z of the optical element 1 (FIGS. 13*a* and 13*b*) normal to the support surface P of the device itself, and only thereafter is diverted along the axis $z_0$ of the vehicle by means of the prismatic component of the transparent element 11 (FIG. 13*c*). The introduction of the prismatic system makes it possible directly to displace along the axis, to D', the initially designed distribution D (FIG. 13*d*). For moderately off-axis lamps, that is for those lamps the disposition of which is strongly inclined with respect to the longitudinal axis $z_0$ of the vehicle, the solution of constructing the distribution with respect of the axis z of the lamp itself in order then to divert it by means of the prism into the correct direction is the best, as long as it is desired to contain the thickness of the lamp. In the case of moderately off-axis lamps it is in fact very difficult, by adding optical power to the transparent element and making use of a collimator of the type such as those known, to succeed in achieving a non-symmetrical light intensity distribution. In particular cases it is possible directly to utilise a prismatic component also in the solid body 1, thereby making it possible to reduce the angle of the prisms on the transparent element 11, as shown in FIG. 14.

Another advantage of this configuration lies in the fact that it has a high tolerance in assembly phase; this is because the distribution of light intensity is generated by the module M and the prismatic transparent element 11 now only has the purpose of diverting the generated beam, wherever the device M is positioned behind the transparent element the distribution is correctly centred with respect to the axis $z_0$ of the vehicle.

Figure 15:
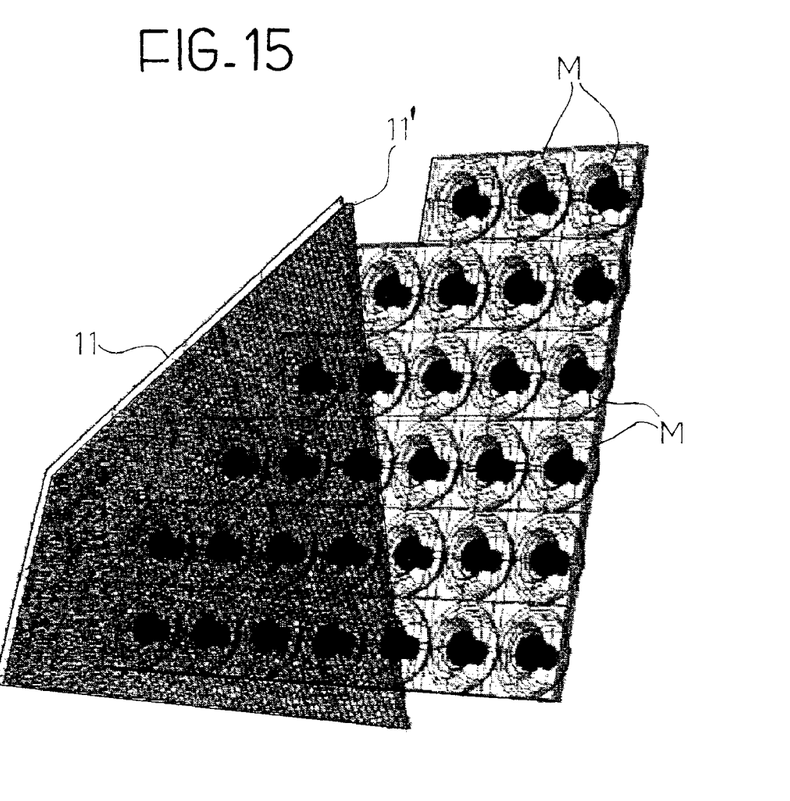
FIG. 15 is an exploded view of a portion of a lamp.

The prismatic component is introduced into the internal part of the transparent element 11, as shown in FIGS. 15 and 16, and is able to correct all the angular differences existing between the optical axis z of the module M and vehicle axis $z_0$.

Each module M of the lamp portion F which performs a given signalling function produces all the intensity distribution relating to this signalling function (contrary to what is envisaged by Patent Application WO 00/24062); this means that for each direction of observation the surface of the whole of the lamp portion dedicated to a given signalling function is uniformly illuminated.

Figure 17:
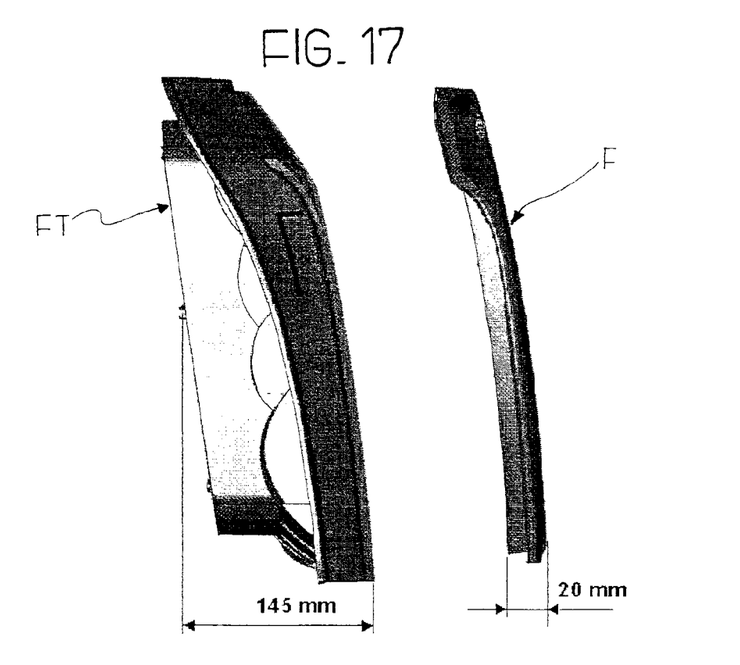
FIG. 17 shows a comparison of the thicknesses of lamp of traditional type with one formed using the modules according to the invention.

In FIG. 17 is proposed the comparison between a lamp FT designed with traditional technology (with incandescent source) and a lamp F designed by utilising the devices according to the invention. The thickness difference is evident and has as its principal advantage the simplification of the design of the bodywork of the motor vehicle and a reduction in costs in that it is no longer necessary to form a pocket for receiving the lamp.

The invention claimed is:

1. An optical module for the projection of a light beam, comprising a light source (10) and a solid body (1) of transparent material having a principal axis (z), in which is formed a cavity (13) for receiving the light source (10), the said cavity (13) extending along the said principal axis (z) of the transparent body (1) and being delimited laterally by a radially inner surface (3) and at one end by a terminal surface (2) of the transparent body (1), the said surfaces (2, 3) being configured to receive respective separate portions (I, II) of the light flux generated by the said source (10), in which the transparent body (1) further has a radially outer surface (4) which is disposed in such a way as to surround the said radially inner surface (3), the said radially outer surface (4) being configured to reflect the portion of the light flux (I) coming from the radially inner surface (3) in a direction substantially parallel to the principal axis (z) of the body (1) and in which the transparent body (1) has on the side opposite that of the cavity (13), a central surface (6) and an annular surface (5) surrounding the said central surface (6), configured to receive, respectively, the portion of the light flux (II) coming from the terminal surface (2) and the portion of the light flux (I) reflected by the radially outer surface (4) and to transmit the said light flux portions (I, II) in directions having predetermined orientations with respect to the principal axis (z) of the transparent body (1);

wherein at least one of the said surfaces (2, 3, 5, 6) is rotationally non-symmetric with respect to the said principal axis (z) of the transparent body (1), the said surfaces (2, 3, 5, 6) cooperating in such a way as to conform the overall light flux (I, II) exiting from the said central and annular surfaces (6, 5) into a light intensity distribution output having a horizontal spread in a first direction perpendicular to the principle axis and a vertical spread in a second direction perpendicular to the principle axis and perpendicular to the first direction, the horizontal spread in the first direction being different than the vertical spread in the second direction;

wherein said radially outer surface (4) is joined to the radially inner surface (3) by a substantially flat connecting surface (9) perpendicular to the said axis (z) of the transparent body (1), the said light source being disposed flush with the said connecting surface (9), and wherein said central surface (6) is designed so as to receive the entire and only portion of the light flux (II) coming from the terminal surface (2).

2. An optical module according to claim 1, in which the said radially inner surface (3) is substantially cylindrical, having an axis coincident with the said axis (z) of the transparent body (1).

3. An optical module according to claim 1, wherein said radially outer surface (4) is curved.

4. An optical module according to claim 3, in which the said radially outer surface (4) is segmented into a plurality of reflecting portions (4*a*, 4*b*, 4*c*; 4*a'*, 4*b'*, 4*c'*).

5. An optical module according to claim 4, in which the said reflecting portions (4*a*, 4*b*, 4*c*) are formed as substantially ellipsoidal or paraboloidal surfaces.

6. An optical module according to claim 1, wherein said radially outer surface (4) is configured to reflect the light by total internal reflection.

7. An optical module according to claim 1, in which the said radially outer surface (4) has a reflecting coating.

8. An optical module according to claim 1, in which the said radially outer surface (4) is rotationally asymmetric with respect to the said principal axis (z).

9. An optical module according to claim 1, in which the said reflecting surface (4) is segmented.

10. An optical module according to claim 1, in which the said terminal surface (2) is curved and is joined to the radially inner surface (3).

11. An optical module according to claim 10, in which the said terminal surface (2) has an optical axis coincident with the said principal axis (z) and is rotationally symmetric with respect to the said axis (z).

12. An optical module according to claim 1, in which the said central surface (6) is curved and is connected to the annular surface (5), the said annular surface (5) being substantially perpendicular to the said axis (z) of the transparent body (1).

13. An optical module according to claim 12, in which the said central surface (6) is joined to the said annular surface (5) by a substantially conical connecting surface (7).

14. An optical module according to claim 12, in which the said central surface (6) in combination with the said terminal surface (2) is configured to generate a substantially uniform light intensity distribution of rectangular form in plan perpendicular to the principal axis (z), having a horizontal spread equal to about ±20 degrees and a vertical spread equal to about ±10 degrees.

15. An optical module according to claim 12, in which the central surface (6) is segmented (6a, 6b, 6a).

16. A module according to claim 1, wherein the light source (10) is disposed on a support plane (P) in such a way as to emit light from one side only of the said plane, and the substantially flat connecting surface (9) rests on the support plane (P).

17. A module according to claim 16, in which the said source is a solid state source.

18. A module according to claim 17, in which the said source is an LED having an emitter of rectangular or square shape and an axis of emission orientated perpendicular to the support plane (P).

19. A module according to claim 17, in which the source is formed with Chip On Board technology.

20. A module according to claim 18, in which the said LED is of Surface Mounted Device type.

21. A lamp (F) for a vehicle comprising at least one portion (Fl, F2, F3, F4) performing a light signalling function, in which the said portion comprises a plurality of modules (M) according to claim 17, wherein said modules being disposed on a common support plane (P) and electrically connected via conductive tracks formed on the said support plane.

22. A lamp according to claim 21, in which each of the said modules shapes the beam emitted by the respective source in such a way as to generate a predetermined angular distribution of light intensity, the said distribution being substantially symmetrical with respect to a pair of axes perpendicular to one another and to the principal axis (z).

23. A lamp according to claim 21 comprising:
a container base (15) of plastics material disposed close to the said support plane on the opposite side from that of light emission, and
a further transparent element (11) having the function of transmitting the light from the said modules,
wherein said container base (15) and the said transparent element (11) form a closed and sealed volume within which the said modules are positioned.

24. A lamp according to claim 23, in which the said transparent element (11) is configured to deflect the light beam emitted from each of the said modules angularly in the direction of the longitudinal axis of the said vehicle.

25. A lamp according to claim 23, wherein said transparent element (11) is configured to vary the spread of the light beam emitted by each of the said modules.

26. A lamp according to claim 21, wherein the axis perpendicular to the support plane does not coincide with the longitudinal axis of the vehicle.

27. A lamp according to claim 23, wherein said transparent element (11) has an inner surface (11') comprising an additional prismatic component configured angularly to deflect the light beam emitted from each of the said modules in the direction of the longitudinal axis of the vehicle.

28. A lamp according to claim 21, in which at least one portion of the said transparent element (1) is coloured.

29. A lamp according to claim 23, having an overall thickness less than 20 mm.

30. A lamp according to claim 21, wherein the modules (M) relating to at least a single portion (Fl, F2, F3 and F4) of the lamp are joined together in such a way as to form a single transparent optical module, obtainable for example by injection moulding.

* * * * *